(12) United States Patent
Chen et al.

(10) Patent No.: US 7,005,667 B2
(45) Date of Patent: Feb. 28, 2006

(54) BROAD-SPECTRUM $Al_{(1-x-y)}In_yGa_xN$ LIGHT EMITTING DIODES AND SOLID STATE WHITE LIGHT EMITTING DEVICES

(75) Inventors: Cheng Chuan Chen, Tainan Science-Based Industrial Park (TW); Ming Chang Chen, Tainan Science-Based Industrial Park (TW)

(73) Assignee: Genesis Photonics, Inc., Tainan Science-Based Industrial Park (TW)

( * ) Notice: Subject to any disclaimer, the term of this patent is extended or adjusted under 35 U.S.C. 154(b) by 0 days.

(21) Appl. No.: 10/929,354

(22) Filed: Aug. 30, 2004

(65) Prior Publication Data

US 2005/0092980 A1    May 5, 2005

(30) Foreign Application Priority Data

Aug. 28, 2003 (TW) ............................. 92123734 A (51) Int. Cl.
*H01L 29/06* (2006.01)
(52) U.S. Cl. .......................... 257/14; 257/22; 257/103
(58) Field of Classification Search ................ 257/14, 257/22, 101–103
See application file for complete search history.

(56) References Cited

U.S. PATENT DOCUMENTS

| | | | |
|---|---|---|---|
| 6,069,440 A | 5/2000 | Shimizu et al. | |
| 6,239,449 B1 * | 5/2001 | Fafard et al. ................. | 257/17 |
| 6,337,536 B1 * | 1/2002 | Matsubara et al. ......... | 313/498 |
| 6,476,409 B1 * | 11/2002 | Iwasaki et al. ............... | 257/13 |
| 6,501,091 B1 * | 12/2002 | Bawendi et al. ............. | 257/14 |
| 6,515,313 B1 * | 2/2003 | Ibbetson et al. ........... | 257/103 |
| 6,563,139 B1 | 5/2003 | Hen | |
| 6,580,097 B1 | 6/2003 | Soules et al. | |
| 6,592,780 B1 | 7/2003 | Höhn et al. | |
| 6,596,195 B1 | 7/2003 | Srivastava et al. | |
| 2004/0101012 A1 * | 5/2004 | Nakamura et al. ............ | 372/46 |
| 2005/0194608 A1 * | 9/2005 | Chen .......................... | 257/100 |

FOREIGN PATENT DOCUMENTS

JP        2001-028458        1/2001

* cited by examiner

Primary Examiner—T. N. Quach
(74) Attorney, Agent, or Firm—Christensen O'Connor Johnson Kindness PLLC (57) ABSTRACT

A broad-spectrum $Al_{(1-x-y)}In_yGa_xN$ light emitting diode (LED), including: a substrate, a buffer layer, an N-type cladding layer, at least one quantum dot emitting layer, and a P-type cladding layer. The buffer layer is disposed over the substrate. The N-type cladding layer is disposed over the buffer layer to supply electrons. The quantum dot emitting layer is disposed over the N-type cladding layer and includes plural quantum dots. The dimensions and indium content of the quantum dots are manipulated to result in uneven distribution of character distribution of the quantum dots so as to increase the FWHM of the emission wavelength of the quantum dot emitting layer. The P-type cladding layer is disposed over the quantum dot emitting layer to supply holes. A broad-spectrum $Al_{(1-x-y)}In_yGa_xN$ yellow LED may thus be made from the LED structure of this invention, with an emission wavelength at maximum luminous intensity falling within a range of 530~600 nm, and FWHM within a range of 20~150 nm. After packaging an $Al_{(1-x-y)}In_yGa_xN$ blue LED to form a solid state white light emitting device, the mixing of blue light and yellow light would generate white light with a high CRI index, high luminous intensity and capable of various color temperature modulation.

21 Claims, 9 Drawing Sheets

FIG. 9 ly, the drawbacks of such a structure includes
BROAD-SPECTRUM $Al_{(1-x-y)}In_yGa_xN$ LIGHT EMITTING DIODES AND SOLID STATE WHITE LIGHT EMITTING DEVICES

FIELD OF THE INVENTION

This invention relates to a light-emitting diode (LED) and a solid state white light emitting device, more particularly to a broad-spectrum $Al_{(1-x-y)}In_yGa_xN$ LED and a solid state white light emitting device.

BACKGROUND OF THE INVENTION

The rapid development of nitrides emitting devices in recent years has resulted in high demands in high brightness LED, such as backlight used in mobile phones, indicators, and outdoor display panels. Along with the significant enhancement in emission efficiency, high interest and expectation is given to the use of high brightness LED to serve as a white light source. Presently, the structures using high brightness LED to serve as white light sources include the followings:

The first structure is developed by Nichia Kagaku Kogyo Kabushiki Kaisha, where yellow fluorescent powder (YAG: Ce; $Y_3Al_5O_{12}$: $Ce^{3+}$) is added into blue LED to generate mixed white light (with reference to U.S. Pat. No. 6,069,440). Such a structure provides a white light emitting device that is of the lowest cost among the commercially available white light emitting devices. However, because of the blue halo effect, the reducing reliability and low light conversion efficiency of fluorescent powder, and the limited emission efficiency due to the use of a single LED, such a structure cannot attain a white light emitting devices with high color saturation, high luminous intensity, high reliability and capable of various color temperature modulation.

The second structure was recently developed and aimed at improving the poor color rendering index (CRI) of the aforementioned white light source, where ultraviolet A (UVA) was excited to generate red, green and blue fluorescent powder, for producing white light sources with a high CRI index (with reference to U.S. Pat. Nos. 6,592,780; 6,580,097 and 6,596,195). Such a structure involves the drawbacks of poor reliability in the mixture of RGB fluorescent powder. In addition, the light source generated from exciting UVA cannot serve as a mixed light source, thereby resulting in an even lower luminous intensity. Furthermore, such a structure further needs to overcome the safety concerns of resin deterioration and UVA leakage during the packaging process.

The third structure is one of high cost, which joins plural emitting devices to generate high brightness, thereby attaining a white light source with an excellent CRI (with reference to U.S. Pat. No. 6,563,139). However, the commercially available package attained from such a structure is limited to that including red-orange-yellow light AlGaInP LED and nitrides blue LED with a wavelength greater than 580 nm. As such, the drawbacks of such a structure includes the high cost involved in packaging multiple chips, and difficulty involved in packaging the two LEDs of different characteristics, such as thermal stability, driving voltages and material reliability.

In addition, others also suggest the use of plural quantum wells with different wave bands in a single chip to directly generate white light (with reference to JP2001-028458). However, the process for manufacturing such a device and the emission efficiency of such a device cannot meet the performance demands of commercial white light. A further alternative is to use an $Al_{(1-x-y)}In_yGa_xN$ blue light chip to excite AlGaInP for generating yellow light that is then mixed to generate a white light source. However, the low luminous intensity and narrow bandwidth of the yellow light results in poor lighting effects. Yet another alterative is to use ZnSe as the luminescent material (with reference to U.S. Pat. No. 6,337,536). However, the reliability, color saturation, luminous intensity of such is inferior to a white light emitting device of the $Al_{(1-x-y)}In_yGa_xN$ type.

Thus, there has been a need for a novel LED and a solid state white light emitting device capable of resolving the above drawbacks.

SUMMARY OF THE INVENTION

It is thus an object of this invention to provide a broad-spectrum $Al_{(1-x-y)}In_yGa_xN$ LED, comprising: a substrate, a buffer layer, an N-type cladding layer, at least one quantum dot emitting layer, and a P-type cladding layer. The buffer layer is disposed over the substrate. The N-type cladding layer is disposed over the buffer layer and serves to supply electrons. The quantum dot emitting layer is disposed over the N-type cladding layer. The quantum dot emitting layer includes plural quantum dots with an uneven character distribution so as to increase the FWHM (Full Width-Half Maximum) of the emission wavelength of the quantum dot emitting layer. The P-type cladding layer is disposed over the quantum dot emitting layer and serves to supply holes.

A broad-spectrum $Al_{(1-x-y)}In_yGa_xN$ yellow LED may thus be made from the LED laminar structure of this invention, with an emission wavelength at maximum luminous intensity falling within a range of 530~600 nm, and FWHM within a range of 20~150 nm. After packaging with an $Al_{(1-x-y)}In_yGa_xN$ blue LED to form a solid state white light emitting device, the mixing of blue light with yellow light would generate white light with a high CRI index, high luminous intensity, and capable of various color temperature modulation. Since the broad-spectrum emission bandwidth covers the visible spectrum that the human eyes are most sensitive to, this invention significantly enhances the luminous intensity of the white light. The distribution of the broad-spectrum also further increases the CRI index and enhances the various color temperature modulation.

In packaging process, because blue and yellow LED implemented by the solid state white light emitting device of this invention are both made of $Al_{(1-x-y)}In_yGa_xN$, they have similar driving voltages, thermal stability, reliability and ESD impedance characteristics, for significantly reducing the packaging cost and improving the reliability of the packaged devices.

Accordingly, the solid state white light emitting device of this invention may be implemented to serve as or to replace the white light emitting device that is available in the commercial market, such as the white backlight of portable electronic products, vehicular lighting, landscape lighting, decorative lighting, and handheld lighting apparatus.

BRIEF DESCRIPTION OF THE DRAWINGS

These and other modifications and advantages will become even more apparent from the following detained description of a preferred embodiment of the invention and from the drawings in which.

DETAILED DESCRIPTION OF THE PREFERRED EMBODIMENT

Reference is made to the accompanied drawings for explaining the embodiments of LED and solid state white light emitting devices according to this invention embodiment. In the drawings, identical or similar parts are identified by identical or similar reference numerals. In addition, the drawings are for illustrative purpose only, where the dimensions and proportions of the laminar structure as illustrated may be different from the dimensions of the actual laminar structure.

Figure 1:
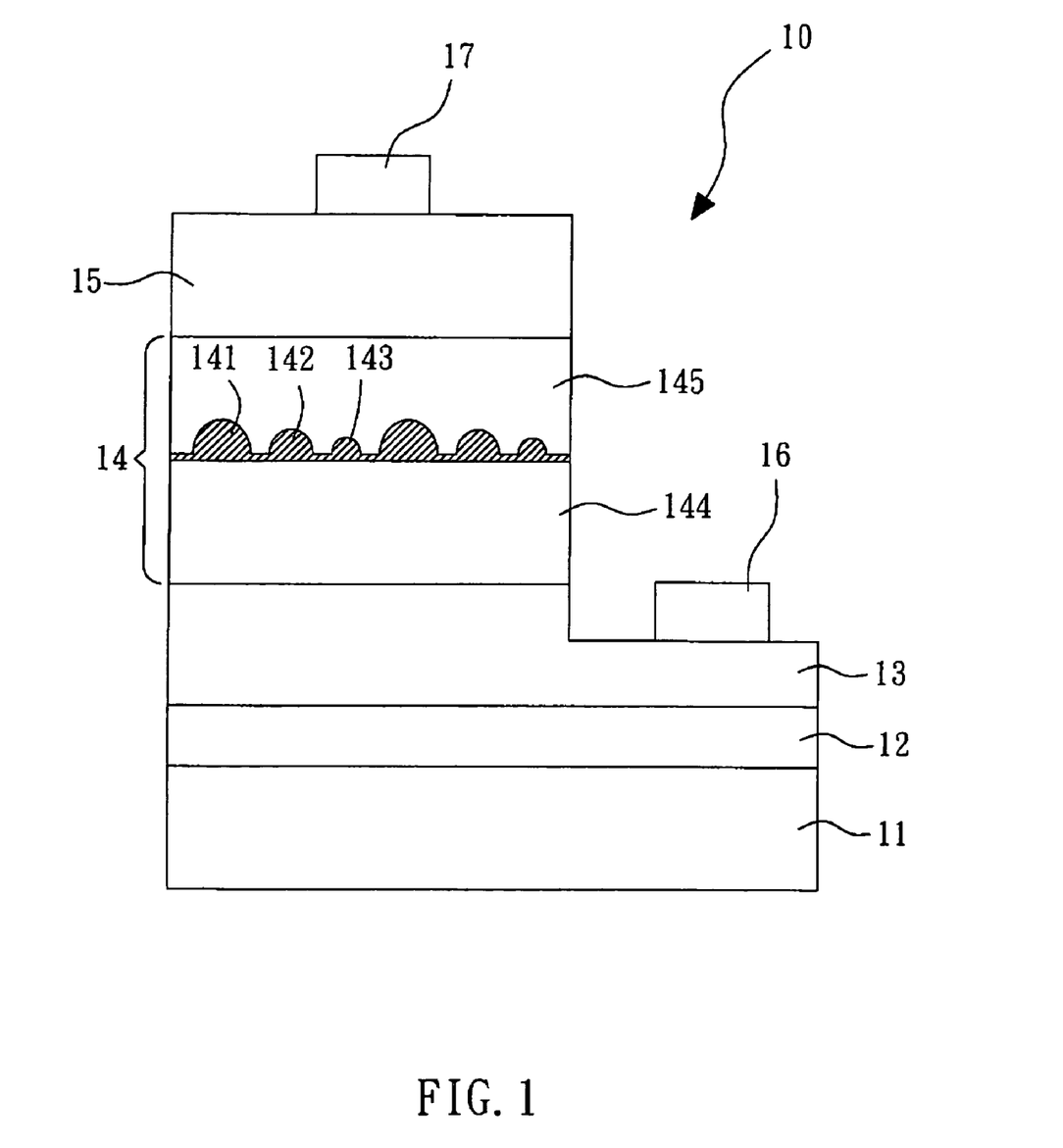
FIG. 1 is a schematic view illustrating the laminar structure of a broad-spectrum $Al_{(1-x-y)}In_yGa_xN$ LED according to a first embodiment of this invention.

FIG. 1 illiterates the laminar structure of a first embodiment for an broad-spectrum $Al_{(1-x-y)}In_yGa_xN$ LED 10 according to this invention. The broad-spectrum $Al_{(1-x-y)}In_yGa_xN$ LED 10 comprises: a substrate 11, a buffer layer 12, an N-type cladding layer 13, a quantum dot emitting layer 14 and a P-type cladding layer 15. The $Al_{(1-x-y)}In_yGa_xN$ LED 10 further comprise two electrodes 16, 17 to be connected to external power sources. The buffer layer 12 is disposed over the substrate 11. The N-type cladding layer 13 is disposed over the buffer layer 12 and serves to supply electrons. The P-type cladding layer 15 is disposed over the quantum dot emitting layer 14 and serves to supply holes. The buffer layer 12, the N-type cladding layer 13 and the P-type cladding layer 15 are all laminations made of $Al_{(1-x-y)}In_yGa_xN$.

The quantum dot emitting layer 14 is disposed over the N-type cladding layer 13. The quantum dot emitting layer 14 includes plural quantum dots 141, 142 and 143 of different dimensions. For example, the quantum dots 141 are of the largest dimensions, the quantum dots 142 the intermediate, and the quantum dots 143 the smallest, to result in an uneven character distribution of the quantum dots, so as to increase the FWHM of the emission wavelength of the quantum dot emitting layer 14.

The quantum dot emitting layer 14 further comprises: a first barrier layer 144 and a second barrier layer 145. The first barrier layer 144 is disposed under the quantum dots and the second barrier layer 145 is disposed over the quantum dots. The first barrier layer 144 and second barrier layer 145 are both laminations made of $Al_{(1-x-y)}In_yGa_xN$. The first barrier layer 144 and second barrier layer 145 each have an energy band gap that is greater than an energy band gap of the quantum dots.

Normally, the first energy band gap 144 is further disposed over the N-type cladding layer 13 and the P-type cladding layer 15 is disposed over second barrier layer 145. Alternatively, the first barrier layer 144 may be of a laminar structure identical to that of the N-type cladding layer 13 so as to become a part of the N-type cladding layer 13. Similarly, the second barrier layer 145 may be of a laminar structure identical to that of the P-type cladding layer 15 so as to become a part of the P-type cladding layer 15.

In the past, LED mostly uses quantum wells to modulate its wavelength. The $Al_{(1-x-y)}In_yGa_xN$ being asymmetrical crystalline induces significant piezo effects due to the asymmetry along C-axis. Thus, though increasing indium content in and thickness of the quantum well would result in increasing wavelength, such measures would also significantly reduce its emission efficiency. Thus, in implementing the conventional quantum well emitting layer in the emitting layer made of $Al_{(1-x-y)}In_yGa_xN$, the drawback of significantly reduced emission efficiency will be observed upon increasing its emission bandwidth to more than 540 nm by increasing the indium content in or the width of the quantum well. Thus, this invention implements the epitaxy structure of the quantum dot emitting layer in increasing the emission efficiency of $Al_{(1-x-y)}In_yGa_xN$ LED under a long wavelength.

Quantum dots use the three-dimensional island formed from lattice mismatch to serve as the carrier boundary in the three-dimensional space. Because the theoretical wavelength of $Al_{(1-x-y)}In_yGa_xN$ covers the spectrum from far UVA to red light, and because the FWHM of the emission wavelength of the quantum dot emitting layer may be manipulated by the dimensions of the quantum dots or the indium content in the quantum dots, the modulation of the dimensions of the quantum dots or indium content in the quantum dots is capable of manipulating the quantum dots to attain an uneven character distribution of the quantum dots so as to attain a broad-spectrum $Al_{(1-x-y)}In_yGa_xN$ LED 10. A yellow LED made from such an LED would have an emission wavelength at maximum luminous intensity falling within a range of 530~600 $\mu$m, and FWHM falling within a range of 20~150 nm.

Figure 7:
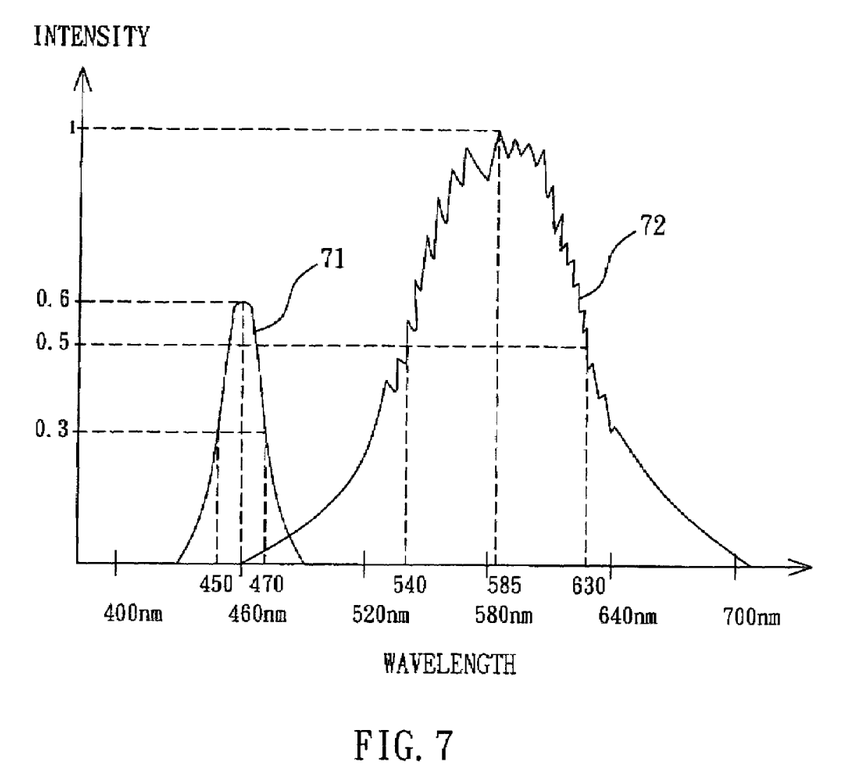
FIG. 7 is a graph illustrating the luminous intensity and bandwidth distribution of the solid state white light emitting device according to this invention.

With reference to FIG. 7, the broad-spectrum $Al_{(1-x-y)}In_yGa_xN$ LED 10 of this invention may be implemented in generating yellow light, such that the emission wavelength at its maximum luminous intensity (of 1) is 585 nm and its FWHM (Full Width-Half Maximum, that is, the wavelength bandwidth at an intensity of 0.5) is 90 nm (a bandwidth of 540~630 nm) so as to feature the LED with a broad-spectrum. Because the broad-spectrum $Al_{(1-x-y)}In_yGa_xN$ LED 10 of this invention may be manipulated to result in an uneven character distribution of the quantum dots, the emission wavelength may be modulated to a maximum luminous intensity and FWHM so as to feature the LED with a broad-spectrum.

Figure 2:
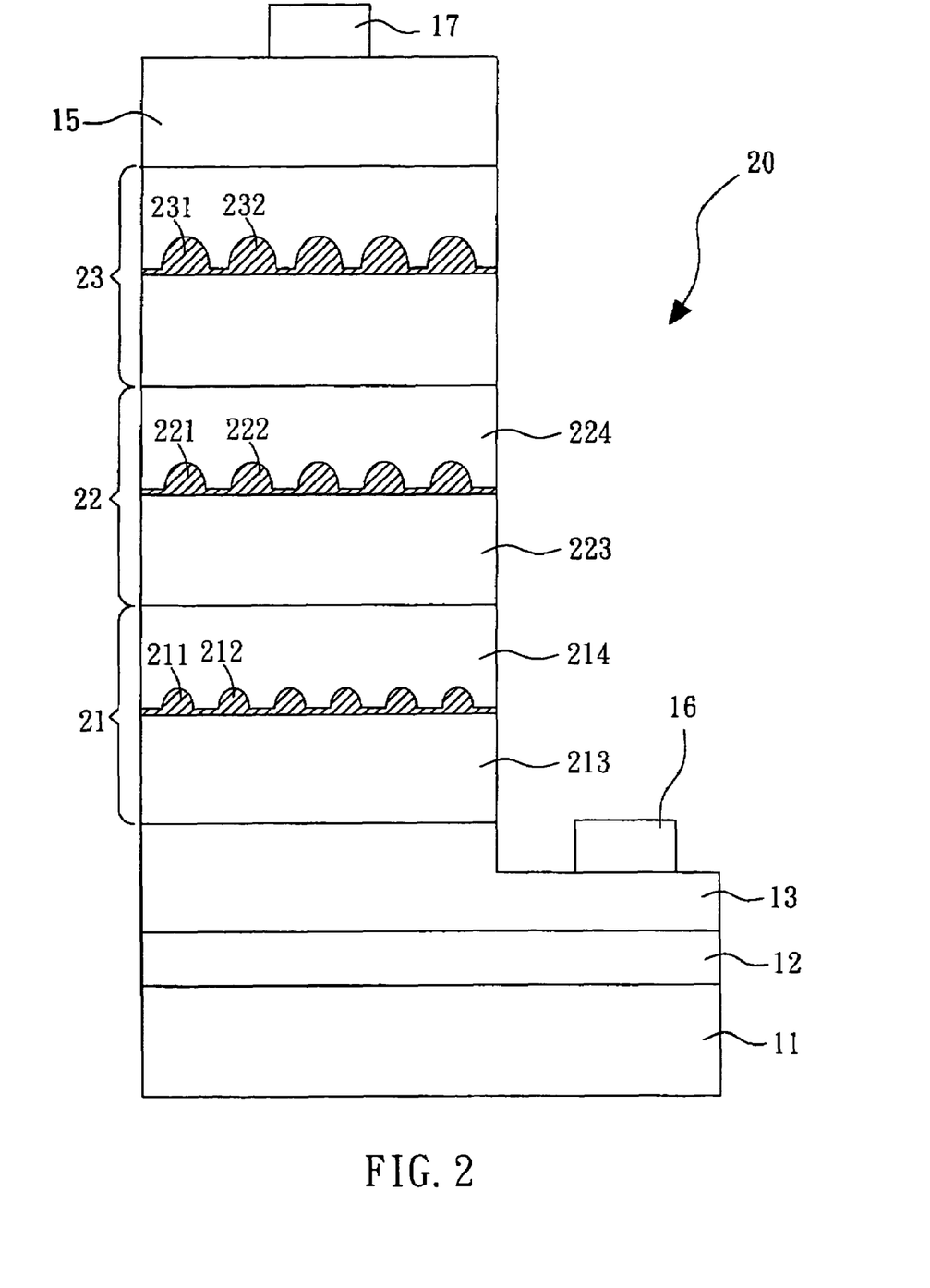
FIG. 2 is a schematic view illustrating the laminar structure of a broad-spectrum $Al_{(1-x-y)}In_yGa_xN$ LED according to a second embodiment of this invention.

As described above, the FWHM of the emission wavelength of the quantum dot emitting layer may be manipulated by the dimensions of the quantum dots or the indium content in the quantum dots. Though the first embodiment of this invention adopts a single layer of quantum dot emitting laminar structure, this invention is not limited to the adoption of a single layer of quantum dot emitting laminar structure. FIG. 2 illustrates the laminar structure of a second embodiment for an broad-spectrum $Al_{(1-x-y)}In_yGa_xN$ LED 20 according to this invention. In FIG. 2, parts that are of structures identical to those in the first embodiment are designated by the same reference numerals, and serve the same functions if not specifically described.

The broad-spectrum $Al_{(1-x-y)}In_yGa_xN$ LED 20 according to the second embodiment of this invention comprises: three quantum dot emitting layers 21, 22, 23, the quantum dot emitting layers each having plural quantum dots. The first quantum dot emitting layer 21 includes plural quantum dots 211, 212; the second quantum dot emitting layer 22 includes plural quantum dots 221, 222; and the third quantum dot emitting layer 23 includes plural quantum dots 231, 232. The LED is such designed so that the dimensions of the quantum dots within a single layer are the same, but are different from the dimensions of the quantum dots in different layers. That is, the plural quantum dots 231, 232 of the third quantum dot emitting layer 23 are of the same dimension, but the dimension of the plural quantum dots 231, 232 of the third quantum dot emitting layer 23 is greater than the dimensions of the quantum dots 221, 222 of the second quantum dot emitting layer 22.

As exemplified by the first quantum dot emitting layer 21, the quantum dot emitting layer 21 further comprises: a first barrier layer 213 and a second barrier layer 214. The first barrier layer 213 is disposed under the quantum dots 211, 212; the second barrier layer 214 is disposed over the quantum dots 211, 212. The first barrier layer 213 and second barrier layer 214 are both laminations made of $Al_{(1-x-y)}In_yGa_xN$. The first barrier layer 213 and second barrier layer 214 each have an energy band gap that is greater than an energy band gap of the quantum dots.

The second quantum dot emitting layer 22 also comprises: a first barrier layer 223 and a second barrier layer 224. The first barrier layer 223 of the second quantum dot emitting layer 22 is disposed over the second barrier layer 214 of the first quantum dot emitting layer 21. Because first barrier layer 223 of the second quantum dot emitting layer 22 and the second barrier layer 214 of the first quantum dot emitting layer 21 are both laminations made of $Al_{(1-x-y)}In_yGa_xN$, either the first barrier layer 223 of the second quantum dot emitting layer 22 or the second barrier layer 214 of the first quantum dot emitting layer 21 may be omitted, such that only a single barrier layer is disposed between the quantum dots 211, 212 of the first quantum dot emitting layer 21 and the quantum dots 221, 222 of the second quantum dot emitting layer 22.

Thus, in a laminar structure having multiple quantum dot emitting layers, two adjacent quantum dot emitting layers may be disposed with one or two barrier layers therebetween. In addition, the laminar structure of the barrier layer may be manipulated to have different proportions of $Al_{(1-x-y)}In_yGa_xN$ content, such that the two adjacent quantum dot emitting layers may be disposed with two or more barrier layers therebetween. So long as the barrier layers each have an energy band gap that is greater than the energy band gap of the quantum dots, the two adjacent quantum dot emitting layers may be disposed with more than one barrier layer therebetween.

The broad-spectrum $Al_{(1-x-y)}In_yGa_xN$ LED 20 according to the second embodiment of this invention adopts a laminar structure having multiple quantum dot emitting layers, where the dimensions of the quantum dots of different quantum dot emitting layers differ from each other to result in an uneven character distribution of the multiple quantum dot emitting layers, thereby achieving the same effect of increasing the FWHM of the emission wavelength of the LED 20.

Figure 3:
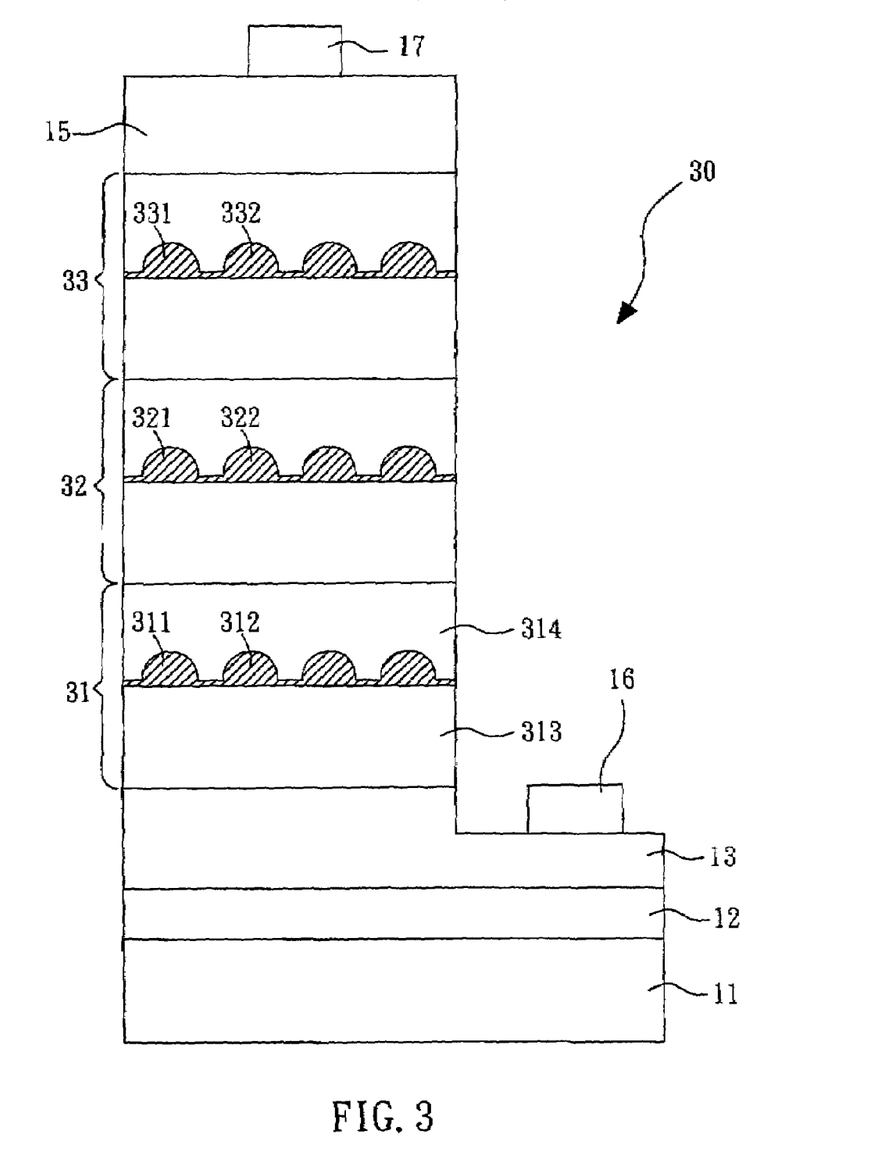
FIG. 3 is a schematic view illustrating the laminar structure of a broad-spectrum $Al_{(1-x-y)}In_yGa_xN$ LED according to a third embodiment of this invention.

FIG. 3 illiterates the laminar structure of a third embodiment for an broad-spectrum $Al_{(1-x-y)}In_yGa_xN$ LED 30 according to this invention. The broad-spectrum $Al_{(1-x-y)}In_yGa_xN$ LED 30 according to the third embodiment of this invention comprises three quantum dot emitting layers 31, 32, 33. The quantum dot emitting layers each have plural quantum dots. The first quantum dot emitting layer 31 includes plural quantum dots 311, 312; the second quantum dot emitting layer 32 includes plural quantum dots 321, 322; the third quantum dot emitting layer 33 includes plural quantum dots 331, 332. The dimensions of all of the quantum dots are the same but the indium content within the quantum dots of different quantum dot emitting layers or within each of the individual quantum dots is different. For example, the plural quantum dots 311, 312 of the first quantum dot emitting layer 31 include 30% of indium content; the plural quantum dots 321, 322 of the second quantum dot emitting layer 32 include 40% of indium content; the plural quantum dots 331, 332 of the third quantum dot emitting layer 33 include 50% of indium content. Summarily, the different indium content within the quantum dots of different quantum dot emitting layers results in an uneven character distribution of the quantum dots of different quantum dot emitting layers, and is thus capable of increasing the FWHM of the emission wavelength of the LED 30.

As exemplified by the first quantum dot emitting layer 31, the quantum dot emitting layer 31 further comprises: a first barrier layer 313 and a second barrier layer 314. The first barrier layer 313 is disposed under the quantum dots 311, 312; the second barrier layer 314 is disposed over the quantum dots 311, 312. The first barrier layer 313 and second barrier layer 314 are both laminations made of $Al_{(1-x-y)}In_yGa_xN$. The barrier layer 313 and second barrier layer 314 each have an energy band gap that is greater than an energy band gap of the quantum dots 311, 312.

Figure 4:
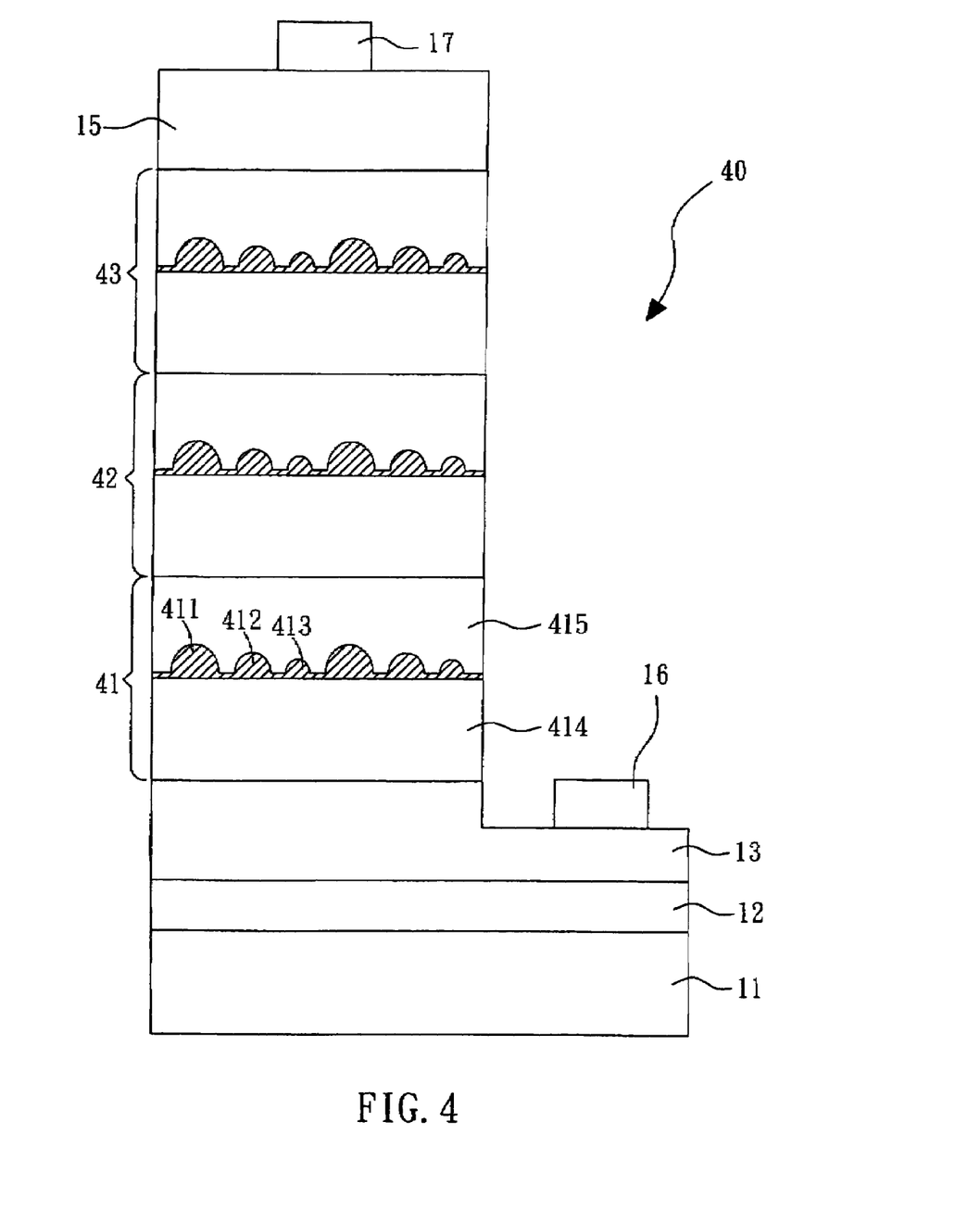
FIG. 4 is a schematic view illustrating the laminar structure of a broad-spectrum $Al_{(1-x-y)}In_yGa_xN$ LED according to a fourth embodiment of this invention.

FIG. 3 illiterates the laminar structure of a fourth embodiment for an broad-spectrum $Al_{(1-x-y)}In_yGa_xN$ LED 40 according to this invention. The $Al_{(1-x-y)}In_yGa_xN$ LED 40 according to the fourth embodiment of this invention comprises three quantum dot emitting layers 41, 42, 43. The quantum dot emitting layers each include plural quantum dots. As exemplified by the first quantum dot emitting layer 41, the first quantum dot emitting layer 41 includes plural quantum dots 411, 412, 413 of different dimensions. For example, the dimensions of the quantum dots 411 are greater than those of the quantum dots 412; and the dimensions of the quantum dots 412 are greater than those of the quantum dots 413. In this embodiment, the dimensions of the quantum dots of different quantum dot emitting layers differ from each other to result in an uneven character distribution of the multiple quantum dot emitting layers, thereby achieving the same effect of increasing the FWHM of the emission wavelength of the LED 40.

As exemplified by the first quantum dot emitting layer 41, the quantum dot emitting layer 41 further comprises: a first barrier layer 414 and a second barrier layer 415. The first barrier layer 414 is disposed under the quantum dots 411, 412, 413; the second barrier layer 415 is disposed over the quantum dots 411, 412, 413. The first barrier layer 414 and second barrier layer 415 are both laminations made of $Al_{(1-x-y)}In_yGa_xN$. The first barrier layer 414 and second barrier layer 415 each have an energy band gap that is greater than an energy band gap of the quantum dots 411, 412, 413.

In the first to fourth embodiments described above, either the measure of varying the dimensions of quantum dots or the measure of varying the indium content within the quantum dots is implemented to result in an uneven character distribution of the quantum dot emitting layers, so as to achieve the effect of increasing the FWHM of the emission wavelength. However, according to this invention, the indium content within the quantum dots may also differ with the dimensions of the quantum dots being different from each other, such as the embodiments illustrated in FIGS. 1, 2 and 4. For example, in the embodiments illustrated in FIG. 2 with quantum dots of different dimensions, the plural quantum dots 211, 212 of the first quantum dot emitting layer 21 may include 40% of indium content; the plural quantum dots 231, 232 of the second quantum dot emitting layer 22 may include 45 of indium content; and the plural quantum dots 231, 232 of the third quantum dot emitting layer 23 may include 70% of indium content. As such, both the dimensions of the quantum dots and the indium content within the quantum dots may be manipulated at the same time.

The broad-spectrum $Al_{(1-x-y)}In_yGa_xN$ LED according to this invention may be implemented in making yellow LED with an emission wavelength at maximum luminous intensity falling within a range of 530~600 nm. It may also be implemented in making blue LED with an emission wavelength at maximum luminous intensity falling within a range of 400~500 nm.

Figure 5:
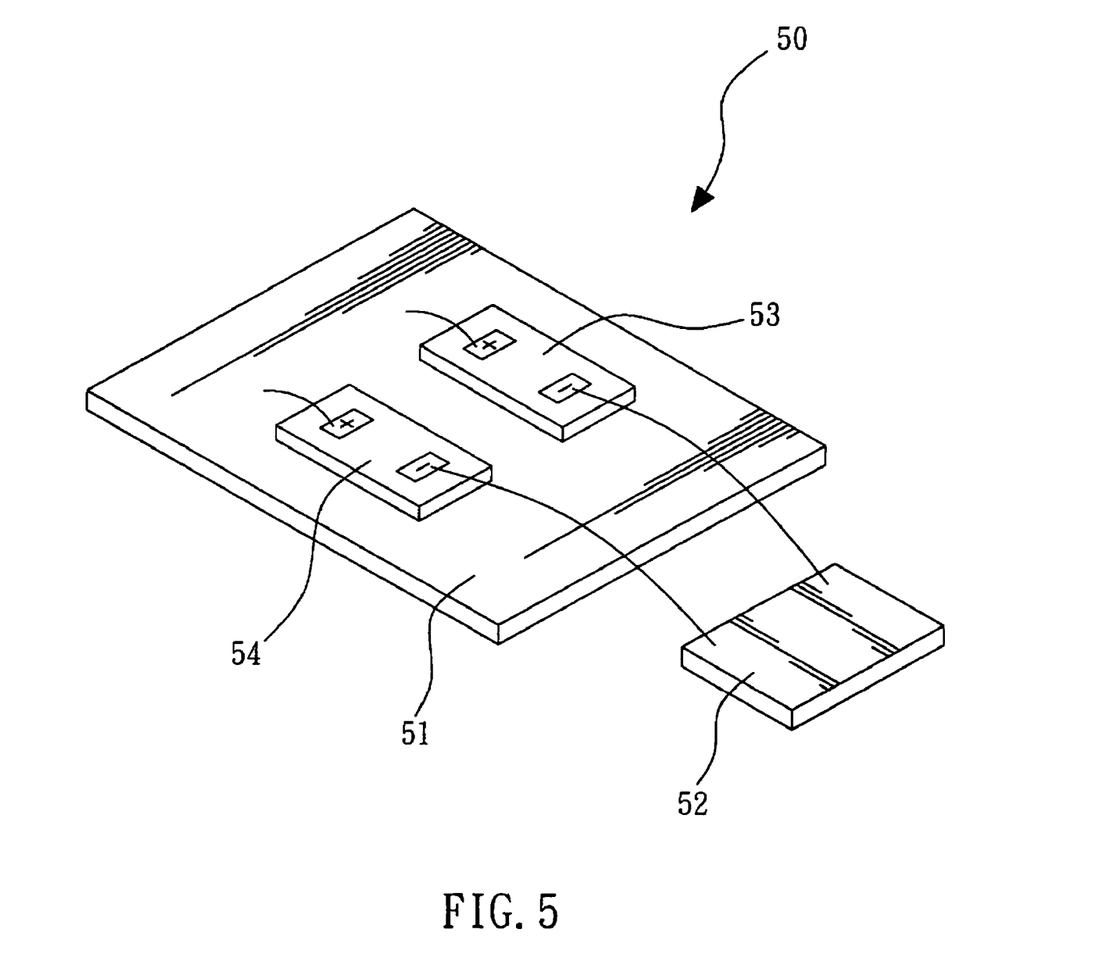
FIG. 5 a schematic view illustrating the laminar structure of a solid state white light emitting device according to this invention.

With reference to FIG. 5, a solid state white light emitting device 50 according to this invention comprises: a first PCB 51, a second PCB 52, an $Al_{(1-x-y)}In_yGa_xN$ blue LED 53 and a broad-spectrum $Al_{(1-x-y)}In_yGa_xN$ blue-complimentary LED 54. The $Al_{(1-x-y)}In_yGa_xN$ blue LED 53 and the broad-spectrum $Al_{(1-x-y)}In_yGa_xN$ blue-complimentary LED 54 are disposed over the first PCB 51. The positive electrons supplied by the first PCB 51 to the $Al_{(1-x-y)}In_yGa_xN$ blue LED 53 and the broad-spectrum $Al_{(1-x-y)}In_yGa_xN$ blue-complimentary LED 54 are electrically connected to a positive external power source. The negative electrons supplied by the second PCB 52 to the $Al_{(1-x-y)}In_yGa_xN$ blue LED 53 and the broad-spectrum $Al_{(1-x-y)}In_yGa_xN$ blue-complimentary LED 54 are electrically connected to a negative external power source.

By packaging the $Al_{(1-x-y)}In_yGa_xN$ blue LED 53 and the broad-spectrum $Al_{(1-x-y)}In_yGa_xN$ blue-complimentary LED 54 together, the mixing of blue light with blue-complimentary light would generate white light. In the laminar structure of the broad-spectrum $Al_{(1-x-y)}In_yGa_xN$ blue-complimentary LED 54 as described in the first to fourth embodiments as described above, the emission wavelength is increased by modulating the dimensions of the quantum dots or the indium content within the quantum dots to manipulate an uneven character distribution of the quantum dots. Accordingly, the solid state white light emitting device 50 according to this invention is capable of generating white light with a high CRI index, high luminous intensity and capable of various color temperature modulation.

The broad-spectrum $Al_{(1-x-y)}In_yGa_xN$ blue-complimentary LED 54 illuminates yellow light with an emission wavelength at maximum luminous intensity falling within a range of 530~600 nm, and FWHM within a range of 20~150 μm. Since the broad-spectrum emission bandwidth covers the visible spectrum that the human eyes are most sensitive to, the two LED 53, 54 constructing the solid state white light emitting device 50 of this invention significantly enhance the luminous intensity of the white light. The distribution of the broad-spectrum of the LED 54 also further increases the CRI index.

In packaging process, because the $Al_{(1-x-y)}In_yGa_xN$ blue LED 53 and the broad-spectrum $Al_{(1-x-y)}In_yGa_xN$ blue-complimentary LED 54 implemented by the solid state white light emitting device 50 of this invention are both made of $Al_{(1-x-y)}In_yGa_xN$, they have similar driving voltages, thermal stability, reliability and ESD impedance characteristics, for significantly reducing the packaging cost and improving the reliability of the packaged devices while packaging the $Al_{(1-x-y)}In_yGa_xN$ blue LED 53 and the broad-spectrum $Al_{(1-x-y)}In_yGa_xN$ blue-complimentary LED 54 together.

Accordingly, the solid state white light emitting device of this invention may be implemented to serve as or to replace the white light emitting device that is available in the commercial market, such as the white backlight of portable electronic products, vehicular lighting, landscape lighting, decorative lighting, and handheld lighting apparatus.

An embodiment is illustrated in FIG. 7, in which Curve 71 illustrates the luminous intensity and bandwidth distribution of an $Al_{(1-x-y)}In_yGa_xN$ blue LED and Curve 72 illustrates the luminous intensity and bandwidth distribution of a broad-spectrum $Al_{(1-x-y)}In_yGa_xN$ blue-complimentary LED. As shown, the emission wavelength of the $Al_{(1-x-y)}In_yGa_xN$ blue LED at its maximum luminous intensity (of 0.6) is 460 nm, and its FWHM (Full Width-Half Maximum, that is, the wavelength bandwidth at an intensity of 0.3) is 20 nm (450~470 μm). The $Al_{(1-x-y)}In_yGa_xN$ blue LED is not featured with a broad-spectrum. The broad-spectrum $Al_{(1-x-y)}In_yGa_xN$ blue-complimentary LED is implemented in generating yellow light, and may be manipulated, such that the emission wavelength at its maximum luminous intensity (of 1) is 585 nm and its FWHM (Full Width-Half Maximum, that is, the wavelength bandwidth at an intensity of 0.5) is 90 nm (a bandwidth of 540~630 nm) so as to feature the LED with a broad-spectrum. By packaging the $Al_{(1-x-y)}In_yGa_xN$ blue LED and the broad-spectrum $Al_{(1-x-y)}In_yGa_xN$ yellow LED together, the mixing of blue light with yellow light would generate white light.

In the embodiment shown in FIG. 7, the luminous intensity (0.6) of the $Al_{(1-x-y)}In_yGa_xN$ blue LED is smaller than the luminous intensity (1) of the broad-spectrum $Al_{(1-x-y)}In_yGa_xN$ yellow LED, such that the white light generated by mixing the blue light with yellow light is one of a warm color temperature. Accordingly, the white light may be modulated into a state of warm color temperature, cold color temperature or the common daylight color temperature by manipulating the scales and proportions of the maximum luminous intensity of the $Al_{(1-x-y)}In_yGa_xN$ blue LED and the broad-spectrum $Al_{(1-x-y)}In_yGa_xN$ yellow LED.

Figure 8:
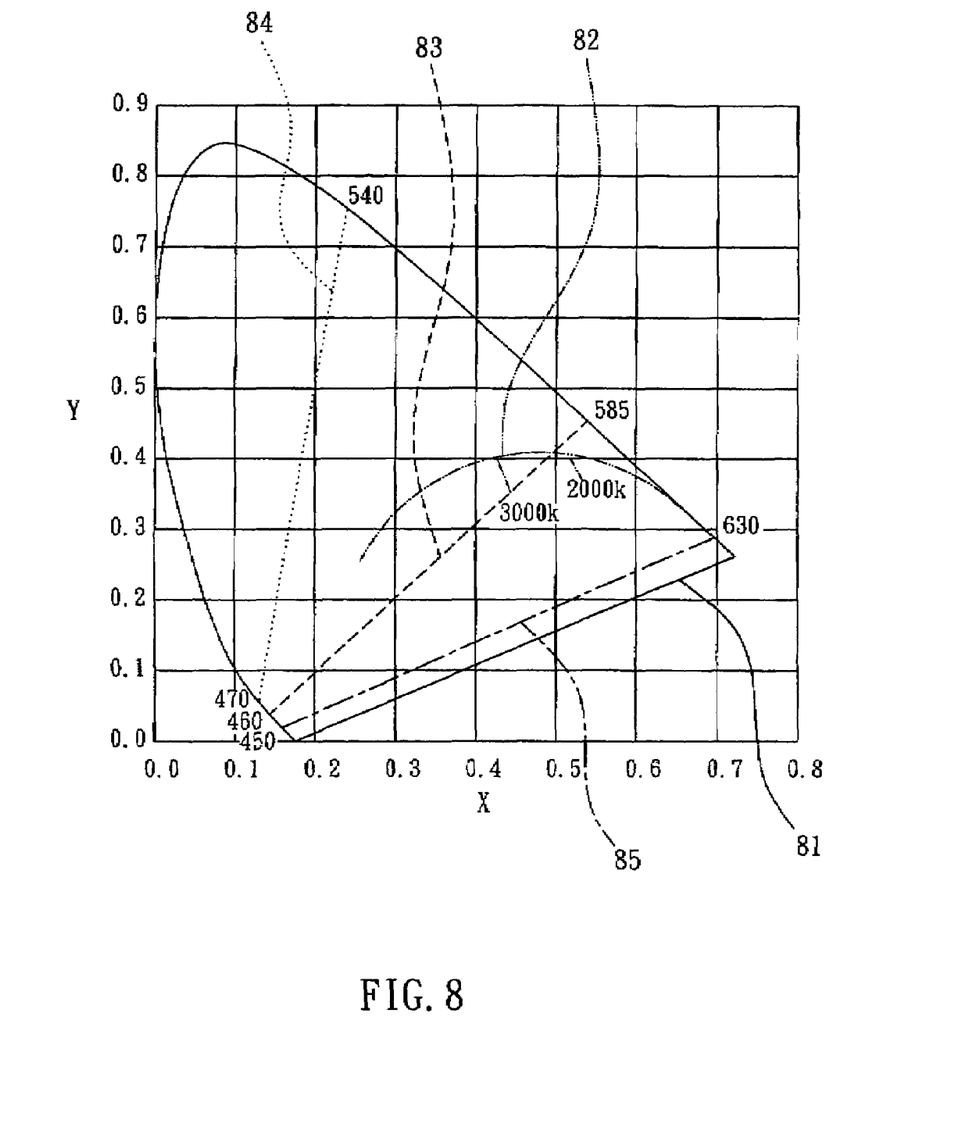
FIG. 8 is a graph illustrating the white light spectrum generated by the solid state white light emitting device according to this invention.

In FIG. 8, Curve 81 illustrates International commission on Illumination (CIE), and Curve 82 illustrates black body locus. A straight line 83 connecting the two points representing the emission wavelength of 460 nm at the maximum luminous intensity of the blue light and the emission wavelength 585 nm at the maximum luminous intensity of the yellow light would intersect the black body locus Curve 82 between values 2000 K and 3000 K, evidencing that the solid state white light emitting device described in the above embodiment is capable of generating white light of warm color temperature. However, since the emission wavelength of the broad-spectrum $Al_{(1-x-y)}In_yGa_xN$ yellow LED at the maximum luminous intensity falls within a range of 530~600 nm, this invention allow modulation of the white light into various color temperatures, such as a state of warm color temperature or cold color temperature (with black body locus greater than 10000 K).

As shown, FWHM of the broad-spectrum $Al_{(1-x-y)}In_yGa_xN$ yellow LED is 90 nm (540~630=m), and the FWHM of the $Al_{(1-x-y)}In_yGa_xN$ blue LED is 20 nm (450~470 nm). A straight line 84 may be plotted by connecting the two points representing wavelengths of 540 nm and 470 nm, and a straight line 85 may be plotted by connecting the two points representing wavelengths of 630 nm and 450 nm. The area bounded by the straight line 84 and straight line 85 indicates an extended white light region, evidencing that that the solid state white light emitting device according to this invention is capable of generating white light with an excellent CRI.

Figure 9:
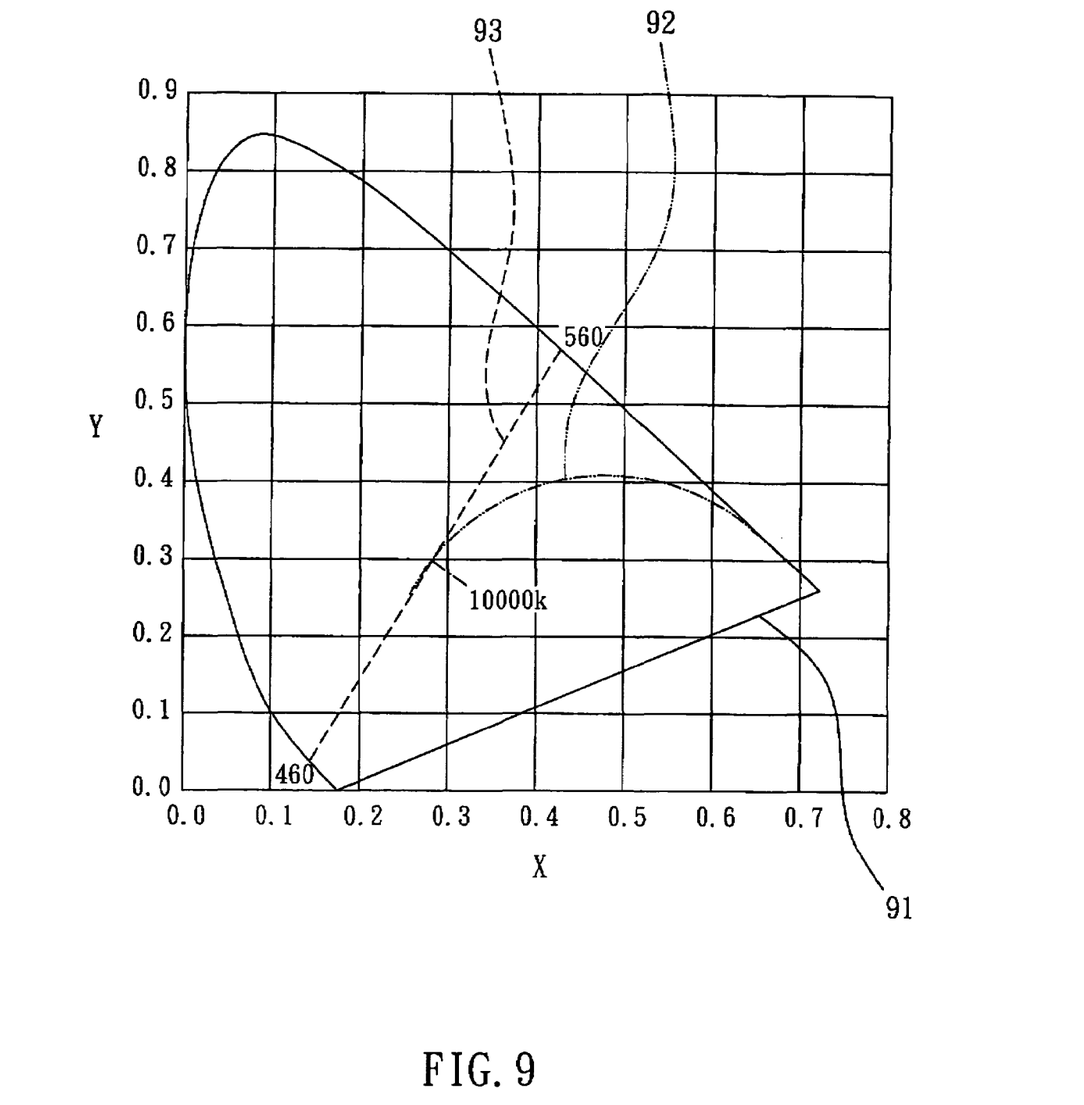
FIG. 9 is a graph illustrating the white light spectrum generated by a conventional solid state white light emitting device.

As compared to the white light emitting device as described in the first prior structure, the first prior white light emitting device mixes blue LED and yellow fluorescent powder to generate white light. With reference to Curve 91 illustrates International commission on Illumination (CIE), and Curve 92 illustrates black body locus. The emission wavelength of the blue LED in the prior white light emitting device at the maximum luminous intensity is 460 nm. The emission wavelength of the yellow fluorescent powder at the maximum luminous intensity is 560 nm. A straight line 93 connecting the two points representing these two wavelengths would intersect the black body locus Curve 92 around at 10000 K, evidencing that the prior white light emitting device generates white light of warm color temperature. In addition, the prior white light emitting device is solely capable of generating white light of warm color temperature but incapable of being modulated to generate white light of warm temperature due to its structural limitations.

To enhance the white light effect, the $Al_{(1-x-y)}In_yGa_xN$ blue LED 53 may take on the laminar structure as described in the first to fourth embodiments, rendering the emission wavelength of the blue LED at the maximum luminous intensity to be within a range of 400~500 nm, and its FWHM within a range of20100 nm. While both the $Al_{(1-x-y)}In_yGa_xN$ blue LED 53 and the broad-spectrum $Al_{(1-x-y)}In_yGa_xN$ blue-complimentary LED 54 are featured with a broad-spectrum, the solid state white light emitting device according to this invention allows better modulation of color temperature and provides higher color saturation.

Figure 6:
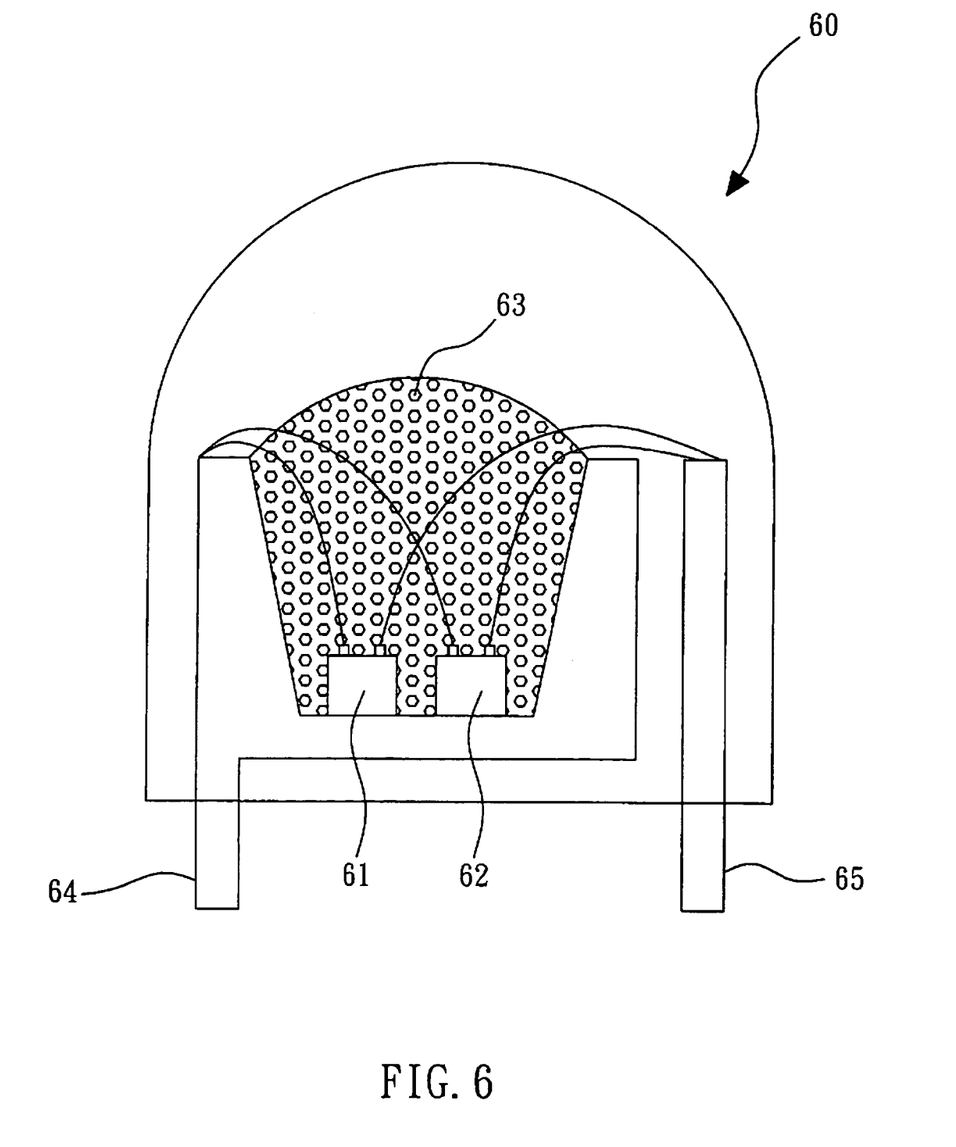
FIG. 6 a schematic view illustrating the overall laminar structure of a solid state white light emitting device according to this invention after packaging.

FIG. 6 a schematic view illustrates the solid state white light emitting device 60 according to this invention. The solid state white light emitting device 60 comprises: an $Al_{(1-x-y)}In_yGa_xN$ blue LED 61, a broad-spectrum $Al_{(1-x-y)}In_yGa_xN$ blue-complimentary LED 62, a first electrode 64 and a second electrode 65. The $Al_{(1-x-y)}In_yGa_xN$ blue LED 61 and the broad-spectrum $Al_{(1-x-y)}In_yGa_xN$ blue-complimentary LED 62 are packaged above the PCB mounted with the first electrode 64. To enhance the white light effect as generated, fluorescent powder 63 may be charged in the packaging process. The fluorescent powder 63 may be red fluorescent powder, green fluorescent powder or a mixture thereof. Accordingly, mixing of the red or green fluorescent powder with the blue light and blue-complimentary light would generate white light. The two LEDs 61, 62 constructing the solid state white light emitting device 60 of this invention further enhance the luminous intensity of the white light and feature the solid state white light emitting device 60 with a high CRI index.

In addition, the solid state white light emitting device according to this invention may be made by packaging a red, a blue and a green LED together, such that mixing of blue light, red light with the green light would generate white light. The solid state white light emitting device comprises: a broad-spectrum $Al_{(1-x-y)}In_yGa_xN$ blue LED, a broad-spectrum $Al_{(1-x-y)}In_yGa_xN$ red LED and a broad-spectrum $Al_{(1-x-y)}In_yGa_xN$ green LED. The broad-spectrum $Al_{(1-x-y)}In_yGa_xN$ green, blue and red LED each take on the laminar structure as described in the first to fourth embodiments to feature the LED with a broad-spectrum.

The emission wavelength of the broad-spectrum $Al_{(1-x-y)}In_yGa_xN$ red LED at the maximum luminous intensity falls within a range of 560~650=m. The emission wavelength of the broad-spectrum $Al_{(1-x-y)}In_yGa_xN$ green LED at the maximum luminous intensity falls with a range of 490~560 μm. The emission wavelength of the broad-spectrum $Al_{(1-x-y)}In_yGa_xN$ blue LED at the maximum luminous intensity falls within a range of 400~490 μm. The FWHM of both the broad-spectrum red LED and the broad-spectrum $Al_{(1-x-y)}In_yGa_xN$ green LED falls with a range of 20~150 nm. The FWHM of the $Al_{(1-x-y)}In_yGa_xN$ blue LED falls with a range 20~100 nm. The solid state white light emitting device made by packaging the above red, blue and green LED together would improve the luminous intensity of the white light emitting device while allowing modulation of the color temperature and CRI.

The solid state white light emitting device of this invention may alternatively be made by packaging a UVA LED, blue light fluorescent powder and a broad-spectrum $Al_{(1-x-y)}In_yGa_xN$ blue-complimentary LED together, such that mixing of the blue light fluorescent powder with the blue-complimentary light would generate white light. The 4addition of the broad-spectrum $Al_{(1-x-y)}In_yGa_xN$ blue-complimentary LED enhances the overall luminous intensity, thereby eliminating the drawback of insufficient luminous intensity found in the prior art that implements a single UVA LED. In addition, the broad-spectrum $Al_{(1-x-y)}In_yGa_xN$ blue-complimentary LED taking on the laminar structure described in the first to fourth embodiments would feature the white light emitting device with a broad-spectrum and allow modulation of the color temperature and CRI.

In the above embodiment, in addition to the blue light fluorescent powder, red fluorescent powder, green fluorescent powder or a mixture thereof may be further added, such that mixing of the red or green fluorescent powder with the blue light fluorescent powder and blue-complimentary would generate white light, so as to allow further modulation of the color temperature and CRI.

It is understood that the invention may be embodied in other forms without departing from the spirit thereof. Thus, the present examples and embodiments are to be considered in all respects as illustrative and not restrictive, and the invention is not to be limited to the details given herein.

While the preferred embodiment of the invention has been illustrated and described, it will be appreciated that various changes can be made therein without departing from the spirit and scope of the invention.

What is claimed is:

1. A broad-spectrum $Al_{(1-x-y)}In_yGa_xN$ LED, comprising:
   a substrate;
   a buffer layer, disposed over the substrate;
   an N-type cladding layer, disposed over the buffer layer;
   at least one quantum dot emitting layer, disposed over the N-type cladding layer, the quantum dot emitting layer including plural quantum dots with an uneven character distribution so as to increase FWHM of emission wavelength of the quantum dot emitting layer; and
   a P-type cladding layer, disposed over the quantum dot emitting layer.

2. The LED of claim 1, wherein the quantum dots are of different dimensions to result in the uneven character distribution of the quantum dots.

3. The LED of claim 1, wherein indium content of the quantum dots is different to result in the uneven character distribution of the quantum dots.

4. The LED of claim 2, wherein indium content of the quantum dots is different to result in the uneven character distribution of the quantum dots.

5. The LED of claim 1, wherein the quantum dot emitting layer further includes a first barrier layer and a second barrier layer, the first barrier layer being disposed under the quantum dots, the second barrier layer being disposed over the quantum dots, the first barrier layer and the second barrier layer each having an energy band gap that is greater than an energy band gap of the quantum dots.

6. The LED of claim 1, comprising plural quantum dot emitting layers, the quantum dot emitting layers each having plural quantum dots and an uneven character so as to increase FWHM of emission wavelength of the quantum dot emitting layer.

7. The LED of claim 6, wherein the quantum dots of the quantum dot emitting layers are of different dimensions to result in the uneven character distribution of the quantum dot emitting layer.

8. The LED of claim 7, wherein indium content of the quantum dots of the quantum dot emitting layers is different to result in the uneven character distribution of the quantum dot emitting layer.

9. The LED of claim 6, wherein indium content of the quantum dots of the quantum dot emitting layers is different to result in the uneven character distribution of the quantum dot emitting layer.

10. The LED of claim 6, wherein the quantum dot emitting layers each further comprise a first barrier layer and a second barrier layer, the first barrier layer being disposed under the quantum dots, the second barrier layer being disposed over the quantum dots, the first barrier layer and the second barrier layer each having an energy band gap being greater than an energy band gap of the quantum dots.

11. The LED of claim 10, wherein two adjacent barrier layers are of an identical laminar structure so as to omit one of the two adjacent barrier layers to become a single barrier layer.

12. The LED of claim 10, wherein a content proportion of laminar structure of the first barrier layer or the second barrier layer is manipulated such that the first barrier layer or the second barrier layer includes plural barrier layers of different content proportions.

13. A solid state white light emitting device, comprising:
an $Al_{(1-x-y)}In_yGa_xN$ blue LED; and
a broad-spectrum $Al_{(1-x-y)}In_yGa_xN$ blue-complimentary LED, packaged with the $Al_{(1-x-y)}In_yGa_xN$ blue LED to mix blue light and blue-complimentary light for generating white light, the broad-spectrum $Al_{(1-x-y)}In_yGa_xN$ blue-complimentary LED including:
a substrate;
a buffer layer, disposed over the substrate;
an N-type cladding layer, disposed over the buffer layer;
at least one quantum dot emitting layer, disposed over the N-type cladding layer, the quantum dot emitting layer including plural quantum dots with an uneven character distribution so as to increase FWHM of emission wavelength of the quantum dot emitting layer; and
a P-type cladding layer, disposed over the quantum dot emitting layer.

14. The solid state white light emitting device of claim 13, wherein the broad-spectrum $Al_{(1-x-y)}In_yGa_xN$ blue-complimentary LED has an FWHM falling with a range of 20~150 nm.

15. The solid state white light emitting device of claim 13, wherein the broad-spectrum $Al_{(1-x-y)}In_yGa_xN$ blue-complimentary LED has an emission wavelength at maximum luminous intensity falling within a range of 530~600 nm.

16. The solid state white light emitting device of claim 13, wherein the $Al_{(1-x-y)}In_yGa_xN$ blue LED includes:
a substrate;
a buffer layer, disposed over the substrate;
an N-type cladding layer, disposed over the buffer layer;
at least one quantum dot emitting layer, disposed over the N-type cladding layer, the quantum dot emitting layer including plural quantum dots with an uneven character distribution so as to increase FWHM of emission wavelength of the quantum dot emitting layer; and
a P-type cladding layer, disposed over the quantum dot emitting layer.

17. The solid state white light emitting device of claim 16, wherein the $Al_{(1-x-y)}In_yGa_xN$ blue LED has an emission wavelength at maximum luminous intensity falling within a range of 400~500 nm.

18. The solid state white light emitting device of claim 16, wherein the $Al_{(1-x-y)}In_yGa_xN$ blue LED has FWHM falling within a range of 20~100 nm.

19. The solid state white light emitting device of claim 13, further comprising red fluorescent powder, packaged with the $Al_{(1-x-y)}In_yGa_xN$ blue LED and the broad-spectrum $Al_{(1-x-y)}In_yGa_xN$ blue-complimentary LED, to mix the red fluorescent powder with the blue light and blue-complimentary light for generating white light.

20. A solid state white light emitting device, comprising:
a UVA LED;
blue light fluorescent powder;
a broad-spectrum $Al_{(1-x-y)}In_yGa_xN$ blue-complimentary LED, packaged with the UVA LED and blue light fluorescent powder, to mix the blue light fluorescent powder and blue-complimentary light for generating white light, the broad-spectrum $Al_{(1-x-y)}In_yGa_xN$ blue-complimentary LED including:
a substrate;
a buffer layer, disposed over the substrate;
an N-type cladding layer, disposed over the buffer layer;
at least one quantum dot emitting layer, disposed over the N-type cladding layer, the quantum dot emitting layer including plural quantum dots with an uneven character distribution so as to increase FWHM of emission wavelength of the quantum dot emitting layer; and
a P-type cladding layer, disposed over the quantum dot emitting layer.

21. The solid state white light emitting device of claim 20, further comprising red fluorescent powder, packaged with the broad-spectrum $Al_{(1-x-y)}In_yGa_xN$ blue-complimentary LED, the UVA LED and blue light fluorescent powder, to mix the red fluorescent powder, blue light fluorescent powder and blue-complimentary light for generating white light.

* * * * *

UNITED STATES PATENT AND TRADEMARK OFFICE
CERTIFICATE OF CORRECTION

PATENT NO. : 7,005,667 B2
APPLICATION NO. : 10/929354
DATED : February 28, 2006
INVENTOR(S) : C.C. Chen et al.

It is certified that error appears in the above-identified patent and that said Letters Patent is hereby corrected as shown below:

| COLUMN | LINE | ERROR |
|---|---|---|
| 1 | 22 | "followings:" should read --following:-- |
| 1 | 33 | "attain a" should read --attain the performance of a-- |
| 1 | 57 | "includes" should read --include-- |
| 2 | 62 | "detained" should read --detailed-- |
| 3 | 10 | "5 a" should read --5 is a-- |
| 3 | 13 | "6 a" should read --6 is a-- |
| 3 | 22 | "invention;" should read --invention; and-- |
| 3 | 39 | "illiterates" should read --illustrates-- |
| 3 | 45 | "further comprise" should read --further comprises-- |
| 4 | 13 | "mostly uses" should read --mostly used-- |
| 4 | 42 | "μm," should read --nm,-- |
| 5 | 66 | "illiterates" should read --illustrates-- |
| 6 | 19 | "Summarily," should read --In summary,-- |
| 6 | 32 | "The barrier" should read --The first barrier-- |
| 6 | 35 | "illiterates" should read --illustrates-- |
| 6 | 36 | "an broad-spectrum" should read --a broad-spectrum-- |
| 7 | 12 | "45" should read --45%-- |
| 7 | 58 | "μm." should read --nm.-- |
| 8 | 24 | "μm)." should read --nm).-- |
| 8 | 47 | "International" should read --International-- |

UNITED STATES PATENT AND TRADEMARK OFFICE
CERTIFICATE OF CORRECTION

PATENT NO.       : 7,005,667 B2
APPLICATION NO.  : 10/929354
DATED            : February 28, 2006
INVENTOR(S)      : C.C. Chen et al.

It is certified that error appears in the above-identified patent and that said Letters Patent is hereby corrected as shown below:

| COLUMN | LINE | ERROR |
|---|---|---|
| 8 | 47 | "commission" should read --Commission-- |
| 8 | 60 | "allow" should read --allows-- |
| 8 | 65 | "=m)," should read --nm),-- |
| 9 | 5 | delete the second occurrence of "that" |
| 9 | 12 | delete "With reference to" |
| 9 | 13 | "International" should read --International-- |
| 9 | 13 | "commission" should read --Commission-- |
| 9 | 34 | "of20100" should read --of 20~100-- |
| 9 | 40 | "6 a" should read --6 is a-- |
| 9 | 40 | "illustrates" should read --illustrating-- |
| 10 | 5 | "=m." should read --nm.-- |
| 10 | 7 | "with" should read --within-- |
| 10 | 7 | "µm." should read --nm.-- |
| 10 | 10 | "µm." should read --nm.-- |
| 10 | 12 | "with" should read --within-- |
| 10 | 13 | "with" should read --within-- |
| 10 | 24 | "4addi-" should read --addi- -- |

UNITED STATES PATENT AND TRADEMARK OFFICE
CERTIFICATE OF CORRECTION

PATENT NO. : 7,005,667 B2
APPLICATION NO. : 10/929354
DATED : February 28, 2006
INVENTOR(S) : C.C. Chen et al.

It is certified that error appears in the above-identified patent and that said Letters Patent is hereby corrected as shown below:

| COLUMN | LINE | ERROR |
|---|---|---|
| 11 | 54-64 | double-indent the following: |
| (Claim 13, | lines 8-17) | "a substrate; |
| | | a buffer...; |
| | | an N-type ...; |
| | | at least one...; and |
| | | 1 P-type...." |
| 12 | 45-55 | double-indent the following: |
| (Claim 20, | lines 10-19) | " a substrate; |
| | | a buffer...; |
| | | an N-type ...; |
| | | at least one...; and |
| | | 1 P-type...." |

Signed and Sealed this

Twenty-fourth Day of July, 2007

JON W. DUDAS
*Director of the United States Patent and Trademark Office*